(12) United States Patent
Hao et al.

(10) Patent No.: US 10,997,890 B2
(45) Date of Patent: May 4, 2021

(54) SHIFT REGISTER, A GATE DRIVER CIRCUIT AND A DISPLAY DEVICE

(71) Applicants: Beijing BOE Technology Development Co., Ltd., Beijing (CN); BOE Technology Group Co., Ltd., Beijing (CN)

(72) Inventors: Xueguang Hao, Beijing (CN); Yongda Ma, Beijing (CN); Yong Qiao, Beijing (CN); Xinyin Wu, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/630,852

(22) PCT Filed: Jun. 25, 2019

(86) PCT No.: PCT/CN2019/092742
§ 371 (c)(1),
(2) Date: Jan. 13, 2020

(87) PCT Pub. No.: WO2020/057213
PCT Pub. Date: Mar. 26, 2020

(65) Prior Publication Data
US 2021/0074193 A1  Mar. 11, 2021

(30) Foreign Application Priority Data
Sep. 17, 2018  (CN) .......................... 201821520672.5

(51) Int. Cl.
*G09G 3/20* (2006.01)
*G11C 19/28* (2006.01)

(52) U.S. Cl.
CPC ................ *G09G 3/20* (2013.01); *G11C 19/28* (2013.01); *G09G 2310/0267* (2013.01); *G09G 2310/0286* (2013.01); *G09G 2310/08* (2013.01)

(58) Field of Classification Search
CPC ............. G09G 3/20; G09G 2310/0267; G09G 2310/0286; G09G 2310/08; G11C 19/28
See application file for complete search history.

(56) References Cited

U.S. PATENT DOCUMENTS

2015/0317954 A1* 11/2015 Jang ......................... G09G 5/18
345/213
2016/0172054 A1   6/2016 Shao et al.
(Continued)

FOREIGN PATENT DOCUMENTS

| CN | 103474017 A | 12/2013 |
| CN | 105609135 A | 5/2016 |

(Continued)

OTHER PUBLICATIONS

ISR & WO in PCT/CN2019/092742.

*Primary Examiner* — Andrew Sasinowski
(74) *Attorney, Agent, or Firm* — IPro, PLLC

(57) ABSTRACT

Disclosed herein is a shift register, a grid driver circuit and a display device. The shift register may comprise a first pull-down point control circuit having a control end coupled to a pull-up point and two ends coupled to a pull-down point and a first voltage input respectively, a second pull-down point control circuit having two control ends coupled to an input signal and a control input respectively and two ends coupled to the pull-down point and the first voltage input respectively, a first pull-up point control circuit having a control end coupled to the pull-down point and two ends coupled to the pull-up point and the first voltage input respectively, and a second pull-up point control circuit
(Continued)

having a control end coupled to a first clock signal and two ends coupled to the pull-up point and the first voltage input respectively.

14 Claims, 3 Drawing Sheets

(56) References Cited

U.S. PATENT DOCUMENTS

| | | | |
|---|---|---|---|
| 2016/0217728 A1* | 7/2016 | In | G09G 3/3275 |
| 2016/0247479 A1* | 8/2016 | Cho | G09G 3/3677 |
| 2017/0193937 A1* | 7/2017 | Du | G09G 3/3674 |
| 2017/0193938 A1* | 7/2017 | Feng | G11C 19/184 |
| 2018/0122318 A1* | 5/2018 | Cao | G09G 3/3648 |
| 2018/0122322 A1* | 5/2018 | Ji | G11C 19/28 |
| 2018/0294040 A1 | 10/2018 | Hao et al. | |
| 2019/0005867 A1 | 1/2019 | Hao | |
| 2019/0012966 A1* | 1/2019 | Shi | G09G 3/3677 |

FOREIGN PATENT DOCUMENTS

| | | |
|---|---|---|
| CN | 105761758 A | 7/2016 |
| CN | 108346395 A | 7/2018 |
| CN | 108536334 A | 9/2018 |
| CN | 208834749 U | 5/2019 |
| WO | 2020057213 A1 | 3/2020 |

* cited by examiner

SHIFT REGISTER, A GATE DRIVER CIRCUIT AND A DISPLAY DEVICE

TECHNICAL FIELD

The disclosure herein relates to field of display technology, particularly relates to a shift register, a gate driver circuit and a display device.

BACKGROUND

With rapid progress of display technology, there is a development trend of high integration and low cost for display device. In particular, GOA (gate driver on array) technology integrates TFT (Thin Film Transistor) gate switch circuit on array substrate of a display panel to form a scanning driver for the display panel, so that wiring space for the bonding and fan-out regions of a gate integrated circuit (IC) can be reduced. Not only can the manufacturing cost in the two aspects of material cost and manufacturing process be reduced, but also aesthetic design achieving symmetry of both sides and narrow-border of the display panel can be made; further, integration process can also reduce bonding process in gate scanning line direction, thus productivity and yield can be improved.

SUMMARY

In general, a gate driver circuit is composed of a plurality of cascaded shift registers. Drive signal output ends of each level of shift registers are respectively connected with a corresponding grid line. Sequentially input scanning signal to each row of grid lines on the display panel is achieved through all levels of shift registers. However, in the driving process of the gate driver circuit, there is a problem of insufficient discharge of pull-up point and pull-down point of each shift register causing abnormal display image on the display panel. Embodiments according to the present disclosure may provide enhanced discharge of the pull-down point and the pull-up point of a shift register.

Disclosed herein is a shift register, comprising: a first pull-down point control circuit having a control end coupled to a pull-up point, a first end coupled to a pull-down point, and a second end coupled to a first voltage input, the first pull-down point control circuit being configured to connect the pull-down point to the first voltage input under control of the pull-up point; a second pull-down point control circuit having a first control end coupled to an input signal, a second control end coupled to a control input, a first end coupled to the pull-down point, and a second end coupled to the first voltage input, the second pull-down point control circuit being configured to connect the pull-down point to the first voltage input under control of the input signal and control input respectively; a first pull-up point control circuit having a control end coupled to the pull-down point, a first end coupled to the pull-up point, and a second end coupled to the first voltage input, the first pull-up point control circuit being configured to connect the pull-up point to the first voltage input under control of the pull-down point; and a second pull-up point control circuit having a control end coupled to a first clock signal, a first end coupled to the pull-up point, and a second end coupled to the first voltage input, the second pull-up point control circuit being configured to connect the pull-up point to the first voltage input under control of the first clock signal.

According to an embodiment, the second pull-down point control circuit comprises a first transistor with its gate coupled to the input signal to connect the pull-down point to the first voltage input and a second transistor with its gate coupled to the control input to connect the pull-down point to the first voltage input.

According to an embodiment, the first pull-down point control circuit comprises a transistor with its gate coupled to the pull-up point.

According to an embodiment, the first pull-up point control circuit comprises a transistor with its gate coupled to the pull-down point.

According to an embodiment, the second pull-up point control circuit comprises a transistor with its gate coupled to the first clock signal.

According to an embodiment, the shift register further comprises a first transistor with its gate coupled to the input signal and controlled by the input signal to connect the pull-up point to a second voltage input.

According to an embodiment, the shift register further comprises a second transistor and a resistor, the second transistor having its gate coupled to the first clock signal and controlled by the first clock signal to connect a first end of the resistor to the second voltage input, the resistor having a second end coupled to the pull-down point.

According to an embodiment, the shift register further comprises a first output transistor with its gate coupled to the pull-up point and controlled by the pull-up point to connect an output to a second clock signal.

According to an embodiment, the shift register further comprises an output controlled transistor with its gate coupled to the output and controlled by the output to connect the pull-down point to the first voltage input.

According to an embodiment, the shift register further comprises a second output transistor with its gate coupled to the pull-down point and controlled by the pull-down point to connect the output to the second voltage input.

According to an embodiment, the shift register further comprises a first capacitor with a first end coupled to the pull-up point and a second end coupled to the output.

According to an embodiment, the shift register further comprises a second capacitor with a first end coupled to the pull-down point and a second end coupled to the first voltage input.

A gate driver circuit is disclosed herein, comprising the shift register.

A display device is disclosed herein, comprising the gate driver circuit.

DETAILED DESCRIPTION

Figure 1:
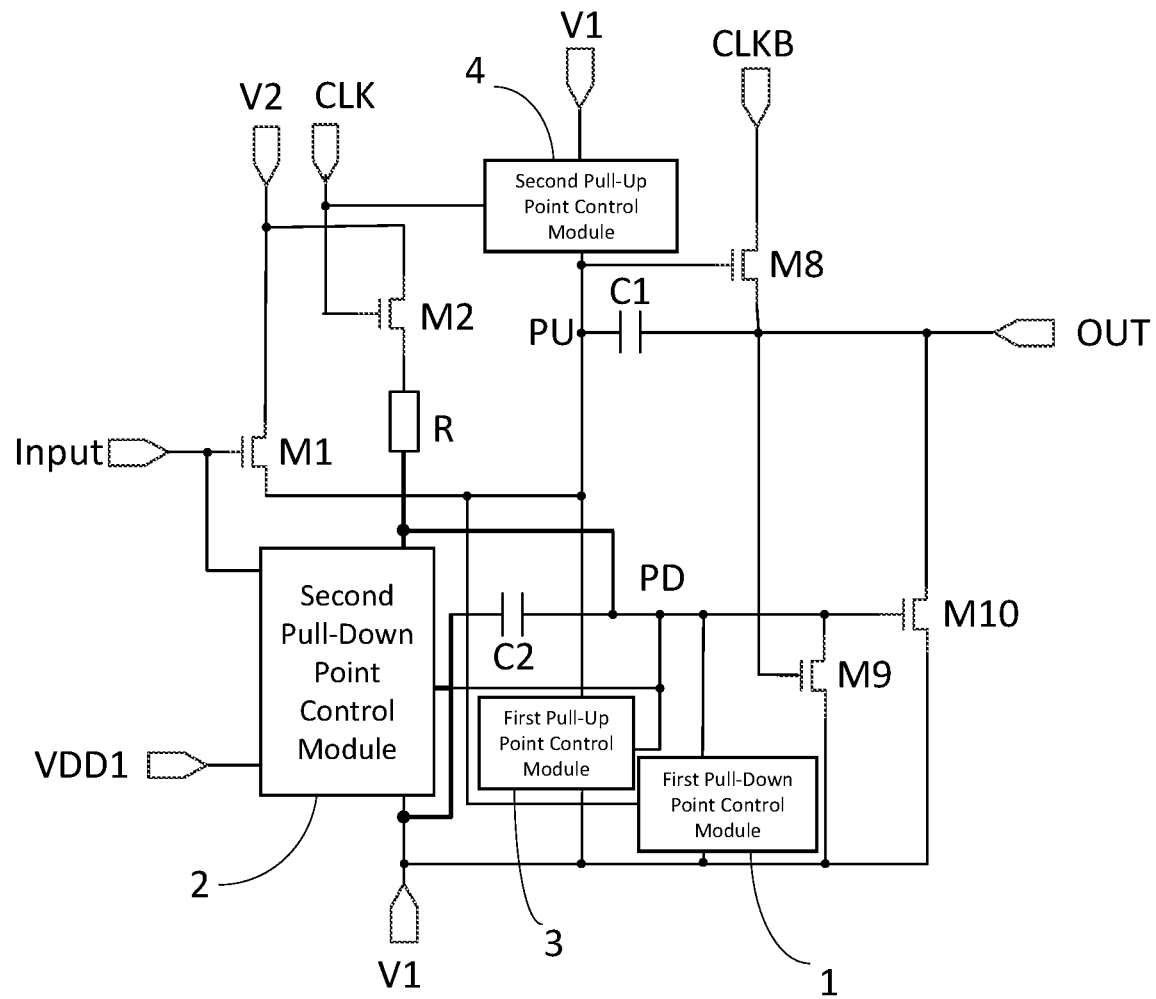
FIG. 1 schematically shows one of structural diagrams of a shift register, according to an embodiment.

According to an embodiment, FIG. 1 shows a shift register, comprising a first pull-down point control module 1, a second pull-down point control module 2, a first pull-up point control module 3 and a second pull-up point control module 4. The first pull-down point control module 1 may also be referred to as the first pull-down point control circuit, the second pull-down point control module 2 may also be referred to as the second pull-down point control circuit. The first pull-up point control module 3 may also be referred to as the first pull-up point control circuit, and the second pull-up point control module 4 may also be referred to as the second pull-up point control circuit.

The first pull-down point control module 1 may comprise a control end, a first end and a second end. The control end may be coupled to a control signal and the first pull-down point control module 1 may be configured to use the control signal to establish or break the connection between the first end and second end. In the embodiment shown in FIG. 1, the control end of the first pull-down point control module 1 is connected to a pull-up point PU. The first end of the first pull-down point control module 1 is connected to a first voltage input V1. The second end of the first pull-down point control module 1 is connected to pull-down point PD. Thus, the first pull-down point control module 1 is configured to connect the pull-down point PD to the first voltage input V1 under the control of electric potential of the pull-up point PU.

The second pull-down point control module 2 may comprise two control ends to control connection between the pull-down point PD and the first voltage input V1. The two control ends of the second pull-down point control module 2 are connected to an input signal INPUT and a control input VDD1, respectively. The first end of the second pull-down point control module 2 is connected to the first voltage input V1. The second end of the second pull-down point control module 2 is connected to the pull-down point PD. The second pull-down point control module 2 is configured to provide signal of the first voltage input V1 to the pull-down point PD under the control of the input signal INPUT and control input VDD1.

The first pull-up point control module 3 may comprise a control end, a first end and a second end. The control end may be coupled to a control signal and the first pull-up point control module 3 may be configured to use the control signal to establish or break the connection between the first end and second end. In an embodiment, as shown in FIG. 1, the control end of the first pull-up point control module 3 is connected to the pull-down point PD. A first end of the first pull-up point control module 3 is connected to the first voltage input V1. The second end of the first pull-up point control module 3 is connected to the pull-up point PU. The first pull-up point control module 3 is configured to provide signal of the first voltage input V1 to the pull-up point PU under the control of the pull-down point PD.

The second pull-up point control module 4 may comprise a control end, a first end and a second end. The control end may be coupled to a control signal and the first pull-up point control module 4 may be configured to use the control signal to establish or break the connection between the first end and second end. In an embodiment, as shown in FIG. 1, the control end of the second pull-up point control module 4 is connected to the first clock signal CLK. A first end of the second pull-up point control module 4 is connected to the first voltage input V1. The end of the second pull-up point control module 4 is connected to the pull-up point PU. The second pull-up point control module 4 is configured to provide signal of the first voltage input V1 to the pull-up point PU under the control of the first clock signal CLK.

In the above embodiment of the shift register according to the disclosure, the first pull-down point control module 1 is configured to discharge the pull-down point PD under the control of electric potential of the pull-up point PU. But, if only the first pull-down point control module discharges the pull-down point PD, insufficient discharging of the pull-down point PD may occur. So, when the first pull-down point control module 1 discharges the pull-down point, the second pull-down point control module 2 also discharges the pull-down point. Namely, embodiments according to the present disclosure may comprise the first pull-down point control module 1 and the second pull-down point control module 2 that are configured to simultaneously discharge the pull-down point PD, so that the pull-down point PD may be fully discharged, and normal display of the display panel is not affected.

Similarly, in the above embodiment of the shift register according to the disclosure, the first pull-up point control module 3 may discharge the pull-up point PU under control of electric potential of the pull-down point PD. But, if only the first pull-up point control module 3 discharges the pull-up point PD, discharging of the pull-up point PU may not be sufficient. So that when the first pull-up point control module 3 discharges the pull-up point PU, the second pull-up point control module 4 also discharges the pull-up point PU. Namely, embodiments according to the present disclosure may comprise the first pull-up point control module 3 and the second pull-up point control module 4 that are configured to simultaneously discharge the pull-up point PU. Therefore, the pull-up point PU may be more sufficiently discharged, and normal display of the display panel is not affected.

According to an embodiment, a shift register may comprise a first pull-down point control circuit having a control end coupled to a pull-up point, a first end coupled to a pull-down point, and a second end coupled to a first voltage input, the first pull-down point control circuit being configured to connect the pull-down point to the first voltage input under control of the pull-up point; a second pull-down point control circuit having a first control end coupled to an input signal, a second control end coupled to a control input, a first end coupled to the pull-down point, and a second end coupled to the first voltage input, the second pull-down point control circuit being configured to connect the pull-down point to the first voltage input under control of the input signal and control input respectively; a first pull-up point control circuit having a control end coupled to the pull-down point, a first end coupled to the pull-up point, and a second end coupled to the first voltage input, the first pull-up point control circuit being configured to connect the pull-up point to the first voltage input under control of the pull-down point; and a second pull-up point control circuit having a control end coupled to a first clock signal, a first end coupled to the pull-up point, and a second end coupled to the first voltage input, the second pull-up point control circuit being configured to connect the pull-up point to the first voltage input under control of the first clock signal.

Through combined action of the first pull-down point control circuit and the second pull-down point control circuit, the pull-down point may be brought to the signal level of the first voltage input in a short time. Through combined action of the first pull-up point control circuit and the second pull-up point control circuit, the pull-up point may also be brought to the signal level of the first voltage input within a short time. Therefore, the problem of insufficient discharge of the pull-down point and the pull-up point may be alleviated, and normal display of the display panel may be maintained.

In an embodiment as shown in FIG. 1, the shift register may further comprise a transistor M1. The gate of the transistor M1 is connected with the input signal INPUT. A first terminal of the transistor M1 is connected with a second voltage input V2. Second terminal of the transistor M1 is connected with the pull-up point PU. Under control of the signal input INPUT, the transistor M1 may provide the signal of the second voltage input V2 to the pull-up point PU.

Specifically, in the above embodiment of the shift register according to the disclosure, when signal of the input signal INPUT is at a high electric potential, the transistor M1 is turned on and may provide the signal of the second voltage input V2 to the pull-up point PU, so that the electric potential at the pull-up point PU is brought to the level of the second voltage input V2. When the signal of the input signal INPUT is at a low electric potential, the transistor M1 is turned off.

In an embodiment as shown in FIG. 1, the shift register may further comprise a transistor M2 and a resistor R. The gate of the transistor M2 is connected with the first clock signal CLK. A first terminal of the transistor M2 is connected with the second voltage input V2. Second terminal of the transistor M2 is connected with one end of the resistor R, and the other end of the resistor R is connected with the pull-down point PD. Under the control of the first clock signal CLK, the transistor M2 may provide the signal of the second voltage input V2 to the pull-down point PD.

Specifically, in the above embodiment of the shift register according to the disclosure, when the first clock signal CLK is at a high electric potential, the transistor M2 is turned on and may provide the signal of the second voltage input V2 to an end of the resistor R, and thus provide a voltage to the pull-down point PD after a resistance voltage division. When the first clock signal CLK is at a low electric potential, the transistor M2 is turned off.

In an embodiment as shown in FIG. 1, the shift register further comprises a transistor M8. The gate of the transistor M8 is connected with the pull-up point PU. A first terminal of the transistor M8 is connected with the second clock signal CLKB. A second terminal of the transistor M8 is connected with a signal output end OUT, which may be referred to simply as an output. Under control of the pull-up point PU, the transistor M8 may provide the signal of the second clock signal CLKB to the signal output end OUT, and thus, the transistor M8 may be referred to as an output transistor.

Specifically, in the shift register according to the disclosure, when the electric potential of the pull-up point PU is high, the transistor M8 is turned on and may provide the signal of the second clock signal CLKB to the signal output end OUT. When electric potential of the pull-up point PU is low, the transistor M8 is turned off, so that the signal output end OUT is disconnected from the second clock signal CLKB.

In an embodiment as shown in FIG. 1, the shift register may further comprise a transistor M9. The gate of the transistor M9 is connected with the signal output end OUT. A first terminal of the transistor M9 is connected with the first voltage input V1. A second terminal of the transistor M9 is connected with the pull-down point PD. Under the control of the signal output end OUT, the transistor M9 may provide the signal of the first voltage input V1 to the pull-down point PD, and thus, the transistor M9 may be referred to as an output controlled transistor.

Specifically, in the above embodiment of the shift register according to the disclosure, when the signal output end OUT is at a high electric potential, the transistor M9 is turned on and may provide the signal of the first voltage input V1 to the pull-down point PD. When the signal output end OUT is at a low electric potential, the transistor M9 is turned off.

In an embodiment as shown in FIG. 1, the shift register may further comprise a transistor M10. The gate of the transistor M10 is connected with the pull-down point PD. A first terminal of the tenth transistor M10 is connected with the first voltage input V1. A second terminal of the tenth transistor M10 is connected with the signal output end OUT. Under control of the pull-down point PD, the transistor M10 may provide the signal of the first voltage input V1 to the signal output end OUT. When the signal output end OUT is at a high electric potential, the transistor M9 is turned on and may provide the signal of the first voltage input V1 to the pull-down point PD, and thus the tenth transistor is turned off, and the output signal of the signal output end OUT is kept stable.

Specifically, in the above embodiment of the shift register according to the disclosure, when the pull-down point is at a high electric potential, the transistor M10 is turned on and provides signal of the first voltage input V1 to the signal output end OUT, and performs noise reduction for the signal output end OUT, so that the introduction of noise is avoided. When the pull-down point is at a low electric potential, the transistor M10 is turned off And thus, the transistor M10 may also be referred to as an output transistor.

In an embodiment as shown in FIG. 1, the shift register may further comprise a first capacitor C1 and a second capacitor C2. A first electrode of the first capacitor C1 is connected with the pull-up point PU. A second electrode of the first capacitor C1 is connected with the signal output end OUT. The first capacitor C1 may be used to keep and bootstrap electric potential of the pull-up point PU. A first electrode of the second capacitor C2 is connected with the first terminal of the transistor M3. A second electrode of the second capacitor C2 is connected with the pull-down point PD. The second capacitor C2 may be used to keep and bootstrap electric potential of the pull-down point PD.

Figure 2:
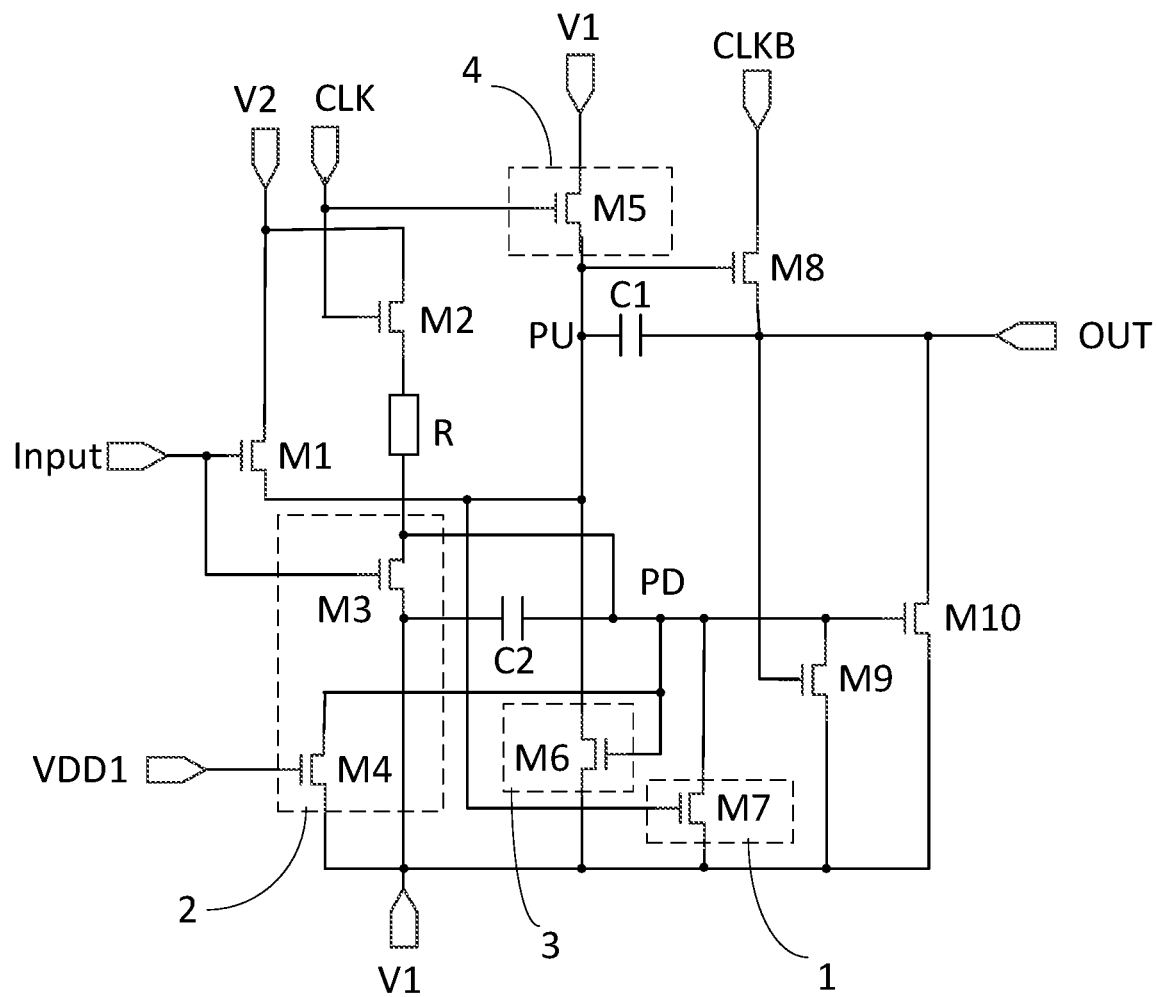
FIG. 2 schematically shows a detailed structural diagram of a shift register according to an embodiment.

FIG. 2 illustrates a detailed structural diagram of a shift register according to an embodiment. It should be noted that the embodiments are used to better explain the disclosure, not used to limit the disclosure. As shown in FIG. 2, the first pull-down point control module 1 may comprise a transistor M7. The gate of the transistor M7 is connected to the pull-up point PU, first terminal of the transistor M7 is connected to the first voltage input V1, second terminal of the transistor M7 is connected to the pull-down point PD.

Specifically, in the above embodiment of the shift register according to the disclosure, when the pull-up point PU is at a high electric potential, the transistor M7 is turned on and provides signal of the first voltage input V1 to the pull-down point PD. When the pull-up point PD is at a low electric potential, the transistor M7 is turned off, and does not discharge the pull-down point PD.

The description above is just an illustration for one embodiment of the first pull-down point control module in the shift register. Specific structure of the first pull-down point control module is not limited to the structure provided by the embodiments disclosed herein, and can also be other structures known to those skilled in the art. No limitation is made here.

In an embodiment as shown in FIG. 2, the second pull-down point control module 2 may comprise a transistor M3 and a transistor M4. The gate of the transistor M3 is connected with an input signal INPUT. A first terminal of the transistor M3 is connected with the first voltage input V1. A second terminal of the transistor M3 is connected with the pull-down point PD. The transistor M3 may provide the signal of the first voltage input V1 to the pull-down point PD under the control of the input signal INPUT. A gate of the transistor M4 is connected with the control input VDD1. A first terminal of the transistor M4 is connected with the first voltage input V1. A second terminal of the transistor M4 is connected with the pull-down point PD. The transistor M4 may provide the signal of the first voltage input V1 to the pull-down point PD under the control of the control input VDD1.

Specifically, in the above embodiment of the shift register according to the disclosure, when the input signal INPUT is at a high electric potential, the transistor M3 is turned on and provides the signal of the first voltage input V1 to the pull-down point PD. When the input signal INPUT is at a low level, the transistor M3 is turned off and does not discharge the pull-down point PD. When the control input VDD1 is at a high electric potential, the transistor M4 is turned on and may provide the signal of the first voltage input V1 to the pull-down point PD. When the control input VDD1 is at a low electric potential, the transistor M4 is turned off and does not discharge the pull-down point PD.

The description above is just an illustration for one embodiment of the second pull-down point control module in the shift register. Specific structure of the second pull-down point control module is not limited to the structure provided by the embodiments disclosed herein, and can also be other structures known to those skilled in the art. No limitation is made here.

In an embodiment as shown in FIG. 2, the first pull-up point control module 3 may comprise a transistor M6. The gate of the transistor M6 is connected with the pull-down point PD. A first terminal of the transistor M6 is connected with the first voltage input V1. A second terminal of the sixth transistor M6 is connected with the pull-up point PU.

Specifically, in the above embodiment of the shift register according to the disclosure, when the pull-down point PD is at a high electric potential, the transistor M6 is turned on and may provide the signal of the first voltage input V1 to the pull-up point PU. When the pull-down point PD is at a low level, the transistor M6 is turned off and does not discharge the pull-up point PU.

The description above is just an illustration for one embodiment of the first pull-up point control module in the shift register. Specific structure of the first pull-up point control module is not limited to the structure provided by the embodiments disclosed herein, and can also be other structures known to those skilled in the art. No limitation is made here.

In an embodiment as shown in FIG. 2, the second pull-up point control module 4 may comprise a transistor M5. The gate of the fifth transistor M5 is connected with the first clock signal CLK. A first terminal of the fifth transistor M5 is connected with the first voltage input V1. A second terminal of the fifth transistor M5 is connected with the pull-up point PU.

Specifically, in the above embodiment of the shift register according to the disclosure, when signal of the first clock signal CLK is at a high electric potential, the transistor M5 is turned on and may provide the signal of the first voltage input V1 to the pull-up point PU. When the signal of the first clock signal CLK is at a low electric potential, the transistor M5 is turned off and does not discharge the pull-up point PU.

The description above is just an illustration for one embodiment of the second pull-up point control module in the shift register. Specific structure of the second pull-up point control module is not limited to the structure provided by the embodiments disclosed herein, and can also be other structures known to those skilled in the art. No limitation is made here.

In an embodiment as shown in FIG. 2, the shift register may also comprise the transistors M1, M2, M8, M9 and M10, the resistor R and capacitors C1 and C2 of the embodiment of the shift register as shown in FIG. 1 and described above.

It should be noted that the above described processes are all illustrated by an example that all the transistors are N-type transistors. When all the transistors are P-type, the working principle is the same as that of the above contents. No detailed description is given again here.

In order to simplify the manufacturing process, in a specific implementation, in a shift register according to the embodiments of the disclosure, all the switch transistors can be a same type of transistors, for example, N-type or P-type. No limitation is given here.

Further, in a specific implementation, in the above embodiment of the shift register according to the embodiments of the disclosure, N-type transistors are turned on by a high-potential signal and turned off by a low-potential signal. P-type transistors are turned off by a high-potential signal and turned on by a low-potential signal.

When all the transistors in an embodiment are N-type transistors, signal of the first voltage input V1 is a low electric potential signal, and signal of the second voltage input V2 is a high electric potential signal. When all the transistors in an embodiment are P-type transistors, signal of the first voltage input V1 is a high electric potential signal, and signal of the second voltage input V2 is a low electric potential signal.

It should be noted that the transistors mentioned in the above embodiments of the disclosure can be thin film transistors (TFT), or metal oxide semiconductor field effect transistors (MOS). No limitation is made here. In a specific implementation, control terminal of each transistor can be used as its gate. According to different transistor type and input signal, first terminal can be used as source, and second terminal can be used as drain; or the first terminal can be as drain, and the second terminal can be used as source. No specific distinction is made here.

Figure 3:
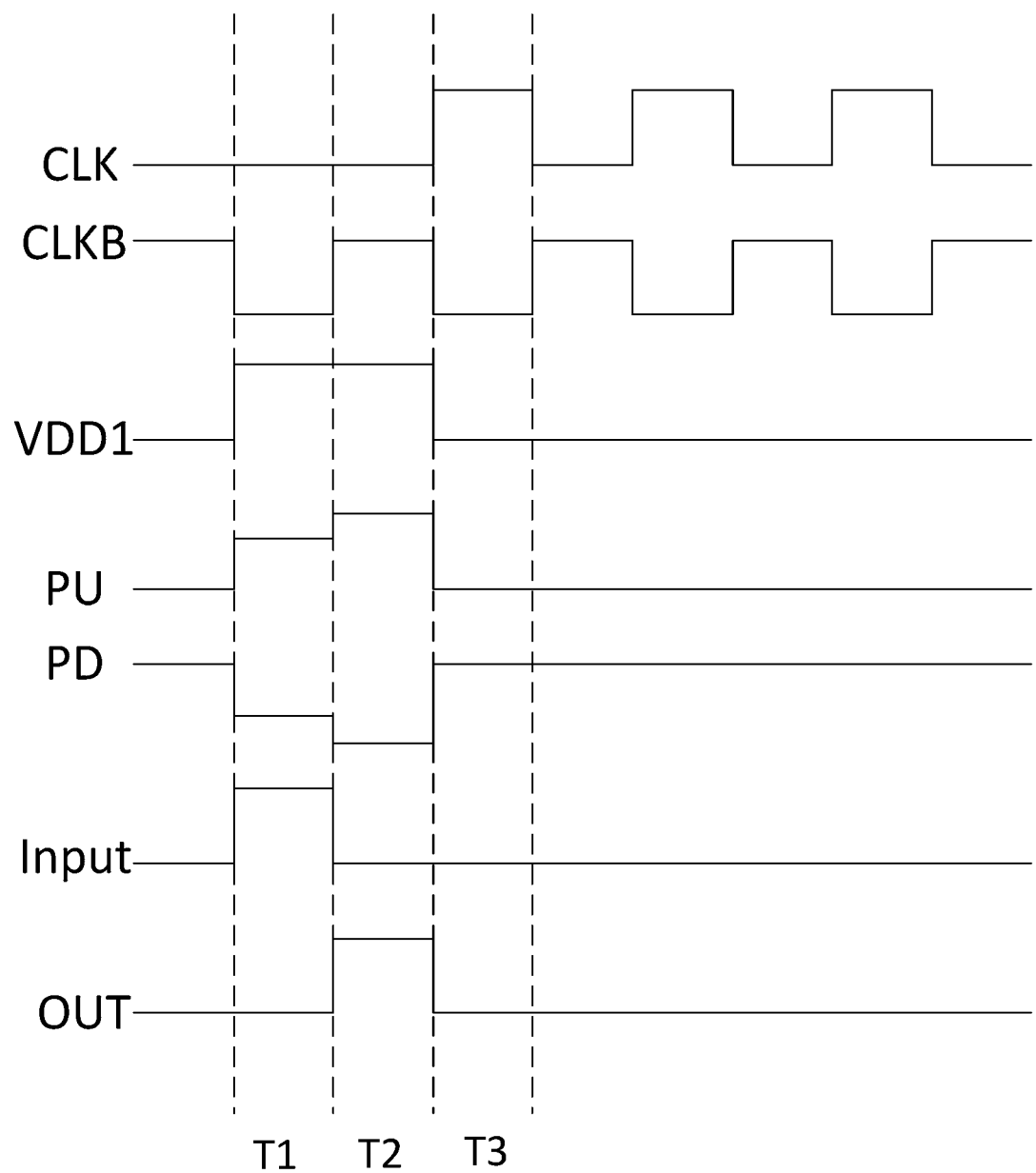
FIG. 3 schematically shows is a timing diagram of the shift register according to an embodiment.

FIG. 3 illustrates a time based sequence diagram for the circuit structure shown in FIG. 2 to illustrate the operation of the shift register according to an embodiment. In general, "1" represents a high level, and "0" represents a low level, without representing a specific electric potential. In the embodiment of the shift register in FIG. 2, the high level may represent a high voltage level and the low level may represent a low voltage level. Specifically, T1 stage, T2 stage and T3 stage are explained in detail below:

During T1 stage, INPUT=1, CLK=0, CLKB=0, VDD1=1, V1=0, V2=1.

With INPUT at high, the transistor M1 is turned on and provides the second voltage signal at the second voltage input V2 to the pull-up point PU. At the same time, with CLK being at low, the transistor M2 is turned off and the pull-up point PU is disconnected from the first input voltage V1. Therefore, the electric potential of the pull-up point PU rises, the first capacitor C1 is charged and the transistor M8 is turned on. The turned-on transistor M8 provides the signal of the second clock signal CLKB to the signal output end OUT. At this moment, the second clock signal CLKB is at low, and thus the signal output end OUT outputs a low level signal. Because the pull-up point PU is at high, the transistor M7 is turned on and provides the low level signal of the first voltage input V1 to the pull-down point PD, and discharges the pull-down point PD. Also, because the input signal INPUT and the control input VDD1 are both at high during the T1 stage, the transistor M3 and the transistor M4 are turned on. The turned-on transistor M3 and turned-on transistor M4 both provide the low level signal of the first voltage input V1 to the pull-down point PD, and also discharges the pull-down point PD.

During T2 stage, INPUT=0, CLK=0, CLKB=1, VDD1=1, V1=0, V2=1.

At the T2 stage, with INPUT at low, the transistor M1 is turned off, thus the pull-up point PU is disconnected from the second input voltage V2. Also, with CLK being low, the transistor M2 is turned off too and the pull-up point PU is disconnected from the first input voltage V1. At this moment, the first capacitor C1 has been charged during the T1 stage, and thus the first capacitor C1 keeps the pull-up point PU to still be at a high level. The transistor M8 is turned on and provides the high level of the second clock signal CLKB to the signal output end OUT. The first capacitor C1 provides bootstrap to the pull-up point PU so that the electric potential of the pull-up point PU is further increased. With control input VDD1, the pull-up point PU and the signal output end OUT being high, the transistors M4, M7 and M9 are turned on respectively and all of them provide the low level signal of the first voltage input V1 to the pull-down point PD at the same time. Therefore, electric potential of the pull-down point PD is further decreased.

During T3 stage, INPUT=0, CLK=1, CLKB=0, VDD1=0, V1=0, V2=1.

With the first clock signal CLK is at high, the transistors M2 and M5 are turned on. The turned-on transistor M2 provides the high level signal of the second voltage input V2 to the pull-down point PD, so that the pull-down point PD is at a high level signal and charges the second capacitor C2. The turned-on transistor M5 provides a low level signal of the first voltage input V1 to the pull-up point PU. Also, with INPUT being low, the transistors M1 and M3 are turned off; with VDD1 being low, the transistor M4 being turned off. M1 being turned off disconnects the pull-up point PU from the second input voltage V2. M3 and M4 being turned off disconnects the pull-down point PD from the first input voltage V1. Because the pull-down point PD is at a high level via M2, the transistors M6 and M10 are turned on. The turned-on transistor M6 provides a low level signal of the first voltage input V1 to the pull-up point PU. The turned-on transistor M10 provides a low level signal of the first voltage input V1 to the signal output end OUT.

It should be noted that at the stages after the T3 stage in the same frame, with the INPUT and VDD1 being low, transistors M1, M3 and M4 are turned off. Due to effect of the second capacitor C2 keeping its electrical charge and the first clock signal CLK periodically being high to turn on the transistors M2 and M5, the pull-down point PD is kept at a high level, the pull-up point PU and the signal output end OUT are kept at a low level, and introduction of noise can be avoided.

Based on the same inventive concept, an embodiment of the disclosure further provides a gate driver circuit, comprising any shift register according to an embodiment of the disclosure.

Based on the same inventive concept, an embodiment of the disclosure further provides a display device that may comprise the above gate driver circuit. A scanning signal is provided for each grid line on the array substrate of the display device through the gate driver circuit. The display device may be a mobile phone, a tablet computer, a television, a monitor, a notebook computer, a digital photo frame, a navigator and any other product or component which has display function. The display device may be implemented according to the above embodiments of the gate driver circuit. Repeated description is omitted.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A shift register, comprising:
a first pull-down point control circuit having a control end coupled to a pull-up point, a first end coupled to a pull-down point, and a second end coupled to a first voltage input, the first pull-down point control circuit being configured to connect the pull-down point to the first voltage input under control of the pull-up point;
a second pull-down point control circuit having a first control end coupled to an input signal, a second control end coupled to a control input, a first end coupled to the pull-down point, and a second end coupled to the first voltage input, the second pull-down point control circuit being configured to connect the pull-down point to the first voltage input under control of the input signal and control input respectively;
a first pull-up point control circuit having a control end coupled to the pull-down point, a first end coupled to the pull-up point, and a second end coupled to the first voltage input, the first pull-up point control circuit being configured to connect the pull-up point to the first voltage input under control of the pull-down point; and
a second pull-up point control circuit having a control end coupled to a first clock signal, a first end coupled to the pull-up point, and a second end coupled to the first voltage input, the second pull-up point control circuit being configured to connect the pull-up point to the first voltage input under control of the first clock signal.

2. The shift register of claim 1, wherein the second pull-down point control circuit comprises a first transistor with its gate coupled to the input signal to connect the pull-down point to the first voltage input and a second transistor with its gate coupled to the control input to connect the pull-down point to the first voltage input.

3. The shift register of claim 1, wherein the first pull-down point control circuit comprises a transistor with its gate coupled to the pull-up point.

4. The shift register of claim 1, wherein the first pull-up point control circuit comprises a transistor with its gate coupled to the pull-down point.

5. The shift register of claim 1, wherein the second pull-up point control circuit comprises a transistor with its gate coupled to the first clock signal.

6. The shift register of claim 1, further comprising a first transistor with its gate coupled to the input signal and controlled by the input signal to connect the pull-up point to a second voltage input.

7. The shift register of claim 6, further comprising a second transistor and a resistor, the second transistor having its gate coupled to the first clock signal and controlled by the first clock signal to connect a first end of the resistor to the second voltage input, the resistor having a second end coupled to the pull-down point.

8. The shift register of claim 1, further comprising a first output transistor with its gate coupled to the pull-up point and controlled by the pull-up point to connect an output to a second clock signal.

9. The shift register of claim 8, further comprising an output controlled transistor with its gate coupled to the output and controlled by the output to connect the pull-down point to the first voltage input.

10. The shift register of claim 8, further comprising a second output transistor with its gate coupled to the pull-down point and controlled by the pull-down point to connect the output to the second voltage input.

11. The shift register of claim 1, further comprising a first capacitor with a first end coupled to the pull-up point and a second end coupled to the output.

12. The shift register of claim 11, further comprising a second capacitor with a first end coupled to the pull-down point and a second end coupled to the first voltage input.

13. A gate driver circuit, comprising the shift register of claim 1.

14. A display device, comprising the gate driver circuit of claim 13.

* * * * *